(12) United States Patent
Gromatzky et al.

(10) Patent No.: US 6,493,440 B2
(45) Date of Patent: Dec. 10, 2002

(54) THERMAL MANAGEMENT FOR A THIN ENVIRONMENTALLY-SEALED LCD DISPLAY ENCLOSURE

(75) Inventors: Jonathan A. Gromatzky, Kernersville, NC (US); Joseph D. Long, Greensboro, NC (US)

(73) Assignee: Gilbarco Inc., Greensboro, NC (US)

(*) Notice: Subject to any disclaimer, the term of this patent is extended or adjusted under 35 U.S.C. 154(b) by 0 days.

(21) Appl. No.: 09/840,338

(22) Filed: Apr. 23, 2001

(65) Prior Publication Data

US 2002/0154255 A1 Oct. 24, 2002

(51) Int. Cl.⁷ .......................................... G02F 1/1225
(52) U.S. Cl. ....................................... 379/161
(58) Field of Search ......................... 349/161

(56) References Cited

U.S. PATENT DOCUMENTS

| | | | |
|---|---|---|---|
| 4,352,961 A | 10/1982 | Kumada et al. | 179/110 A |
| 4,385,210 A | 5/1983 | Marguiss | 179/114 M |
| 4,857,887 A | 8/1989 | Iten | 341/34 |
| 4,932,485 A | 6/1990 | Mori | 177/25.15 |
| 4,950,072 A * | 8/1990 | Honda | 349/161 |
| 4,984,445 A | 1/1991 | Ohuchi et al. | 72/360 |
| 5,170,195 A * | 12/1992 | Akiyama et al. | 349/162 |
| 5,400,414 A | 3/1995 | Thiele | 381/190 |
| D357,198 S | 4/1995 | Gatley | D10/94 |
| 5,488,385 A | 1/1996 | Singhal et al. | 345/3 |
| 5,606,341 A * | 2/1997 | Aguilera | 345/87 |
| 5,647,151 A | 7/1997 | Fantone et al. | 40/454 |
| 5,665,938 A | 9/1997 | Boshear et al. | 174/50 |
| 5,682,216 A * | 10/1997 | Lin et al. | 349/122 |
| 5,691,886 A * | 11/1997 | Stacy | 362/283 |
| 5,694,141 A | 12/1997 | Chee | 345/1 |
| 5,717,564 A | 2/1998 | Lindale | 361/600 |
| 5,748,269 A | 5/1998 | Harris et al. | 349/58 |
| 5,772,300 A * | 6/1998 | Kitai | 353/57 |
| 5,791,770 A | 8/1998 | Hoyt et al. | 362/294 |
| 5,805,255 A * | 9/1998 | Mori et al. | 349/161 |
| 5,828,768 A | 10/1998 | Eatwell et al. | 381/333 |
| 5,961,289 A | 10/1999 | Lohmann | 416/189 |
| 6,026,866 A | 2/2000 | Nanaji | 141/59 |
| 6,052,629 A | 4/2000 | Leatherman et al. | 700/241 |
| 6,072,459 A * | 6/2000 | Asakawa et al. | 345/101 |
| 6,104,451 A | 8/2000 | Matsuoka et al. | 349/58 |
| 6,111,630 A * | 8/2000 | Watanuki et al. | 349/161 |
| 6,151,401 A | 11/2000 | Annaratone | 381/388 |
| 6,176,421 B1 | 1/2001 | Royal, Jr. et al. | 231/381 |

OTHER PUBLICATIONS

"Brushless DC Cross Flow Fan CFS Series".

* cited by examiner

*Primary Examiner*—James Dudek
(74) *Attorney, Agent, or Firm*—Withrow & Terranova PLLC

(57) ABSTRACT

The present invention relates to a thermal management system for a thin depth LCD display enclosure. The LCD display enclosure may be used in environmentally sensitive conditions and may be environmentally-sealed to protect the components of the LCD display from environmental conditions. The LCD display components may include a lens and a LCD module, and other heating producing components, such as backlights and electronic circuitry. The heat producing components and any external heat placed on the enclosure causes the ambient air temperature inside the enclosure to rise thereby possibly causing the LCD display to not operate properly. The ambient air temperature inside the enclosure is lowered by transferring heat in the ambient air through the enclosure to a heat sink that is attached on the outside rear portion of the enclosure, and to the atmosphere using forced convection, natural convention, or both.

39 Claims, 4 Drawing Sheets

THERMAL MANAGEMENT FOR A THIN ENVIRONMENTALLY-SEALED LCD DISPLAY ENCLOSURE

FIELD OF THE INVENTION

The present invention relates to a thermal management system for a LCD display in a thin depth, environmentally-sealed enclosure.

BACKGROUND OF THE INVENTION

LCD displays are commonly used today in devices that require information to be displayed in human-perceptible form. LCD displays are typically comprised of an enclosure, a LCD module, backlights and supporting electronics. Since LCD displays use thin depth LCD modules to display information as opposed to larger in depth cathode ray tube (CRT) displays for similar sized screens, LCD displays are often used in devices that have packaging and/or space constraints. Unlike LCD displays, the tube in a CRT display increases substantially in depth as the screen size increases.

Electronic devices, such as fuel dispensers and automatic teller machines (ATM) for example, use displays to display information to users of these devices. Such information may be instructions on how to use the machine or a customer's account status. Such information may also include other useful information and/or services that generate additional revenue beyond the particular function of the device, such as advertising or newsworthy information. Through increasingly easier and cheaper access to the Internet, it has become even more desirable for electronic devices to use displays that are larger in screen size and employ higher resolution color graphics without substantially increasing the depth of the display due to packaging limitations. Therefore, LCD displays are advantageous to use in displays in electronic devices because of the thin nature of LCD modules.

LCD displays used in outdoor devices typically use an environmentally-sealed enclosure since LCD displays include internal components, such as electronics, backlights and display modules, whose operations are sensitive to outdoor conditions, such as water and dust. However, the backlights and the electronic circuitry generate extreme heat during their operation thereby raising the ambient air temperature inside the enclosure. The ambient temperature in the enclosure rises even more in outdoor devices due to sunlight heat. If the ambient temperature in the enclosure is not managed, components of the LCD display 10 may fail. For example, the LCD module may start to white or black out if the ambient temperature inside the enclosure rises above a certain temperature.

One method keeping the ambient air temperature lower inside the enclosure is to provide a larger enclosure so that it takes more heat generated by the internal components of the LCD display and external sources, such as the sunlight, to raise the ambient air temperature inside the enclosure. However, increasing the size of the enclosure is counter to the goal of using a thin depth enclosure for a LCD display.

Therefore, a need exists to provide a thin LCD display enclosure that is sealed from the environment and is capable of efficiently dissipating heat generated by the internal components of the LCD display and external heat, such as sunlight.

SUMMARY OF THE INVENTION

The present invention relates to a thermal management system for a liquid crystal display (LCD) that is placed inside a thin depth enclosure and may be incorporated into an outdoor device. The thermal management system efficiently transfers and dissipates heat in the ambient air of the LCD display enclosure generated by components of the LCD display and external heat, such as sunlight.

In one embodiment of the present invention, the LCD display comprises an environmentally-sealed, heat conducting enclosure with a backlight assembly having at least one backlight. The backlight assembly is connected to the inside rear portion of the enclosure. A heat sink is attached on the outside rear portion of the enclosure. Heat generated by the backlights is transferred using natural convection from the enclosure to the heat sink, and the heat sink dissipates such heat to the atmosphere.

In another embodiment of the present invention, the LCD display contains the backlight assembly as discussed in the preceding paragraph. The LCD display also contains a lens on the front portion of the enclosure and a LCD module between the lens and the backlight assembly. The LCD module is placed in between the top and bottom of the enclosure to provide air gaps inside and at the top and the bottom of the LCD module to form a circular airflow path around the LCD module. A fan is placed in the airflow path to forcibly move heated air inside the enclosure from the front of the LCD module to the rear portion of the enclosure for heat dissipation through the heat sink and to the atmosphere.

The LCD display may be placed in any type of electronic device, including but not limited to a kiosk, a fuel dispenser, a personal computer, an elevator display, and an automated teller machine (ATM). The LCD display may display information and other instructions to a user of an electronic device incorporating the LCD display. If the LCD display has a touch screen, the LCD display may also act as an input device.

DETAILED DESCRIPTION OF THE INVENTION

The present invention relates to a thermal management system for a LCD display having a thin depth enclosure, and that may be placed in and outdoor environment and/or device. A thermal management system aids the LCD display 10 in overcoming the effects of internal heat generated by components of the LCD display 10 and heat from sunlight heat, if the LCD display 10 is placed in sunlight. The thermal management system also allows a thinner depth enclosure to be used for the LCD display. Use of a thin depth LCD display may be useful for addressing space and packaging issues for devices requiring a display.

Figure 1:
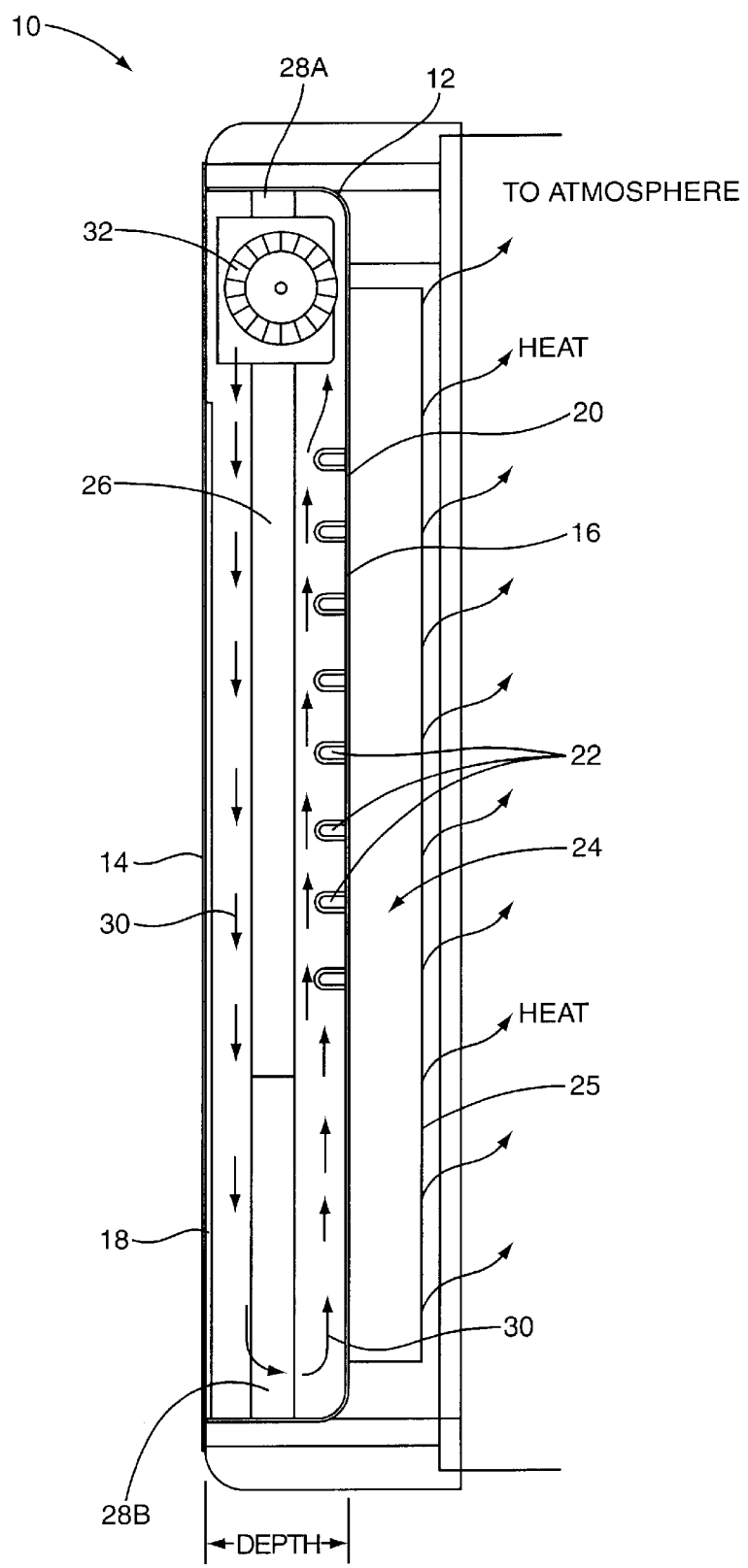
FIG. 1 is a schematic diagram of one embodiment of a thin depth LCD display enclosure having a thermal management system according to the present invention.

A LCD display 10 according to one embodiment of the present invention is illustrated in FIG. 1. The LCD display 10 comprises an environmentally-sealed enclosure 12 that has a front portion 14 and a rear portion 16. The environmentally-sealed enclosure 12 protects the internal components of the LCD display 10 from external elements that may affect the proper operation, such as water, dust, etc. The enclosure 12 is constructed out of a heat conducting material, such as sheet metal, aluminum, or copper for example, so that heat generated by components of the LCD display 10 can be dissipated outside of the enclosure 12 to the atmosphere using convective heat transfer. In one embodiment, the depth of the enclosure 12 is approximately 40 millimeters.

The enclosure 12 includes a transparent lens 18 at the front portion 14 of the enclosure 12 for external viewing of the LCD display 10. The lens protects the internal components of the LCD display 10 and also allows the LCD module 26 to be viewed from outside of the enclosure 12. The lens 18 may be constructed out of clear plastic, glass, Plexiglas, or other transparent material so long as the LCD module 26 can be viewed from outside the enclosure 12. The LCD module 26 may be an active or passive matrix display, may include color, and may pass or block light to provide information for external viewing.

A backlight assembly 20 is provided in the rear portion 16 of the enclosure 12. The backlight assembly 20 holds one or more backlights 22. The backlights 22 project light towards the rear of the LCD module 26 so that the LCD module 26 can be properly viewed through the lens 18. In this particular embodiment, the backlights 22 are flourescent light bulbs. When power is provided to the backlights 22, light is projected from the backlights 22 towards the LCD module 26. The LCD module 26, depending on its design, either blocks the light or allows the light to pass through to display information for external viewing in human-perceptible form through the lens 18.

The LCD display 10 also includes a thermal management system for convectively moving and dissipating heat generated by internal components of the LCD display 10, such as the backlights 22 and electronic circuitry (not shown) in the enclosure 12, as well as external heat on the enclosure 12, such as sunlight. Heat generated by these sources raises the ambient air temperature inside the enclosure 12 thereby possibly causing the LCD display 10 to not function properly. Although the backlights 22 are designed to operate at higher temperatures, the heat generated by the backlights may affect the performance of the LCD module 26. For example, if the LCD module 26 is a color module, the color will start to fade as the ambient temperature inside the enclosure 12 increases beyond designed operating temperatures of the LCD module 26.

It may be desirable for a LCD display 10 in an outdoor device to be brighter than would otherwise be required in an indoor device due to light and glare created by sunlight. Increasing the brightness of the backlights 22 causes the backlights 22 to generate more heat and/or the power to the electronic circuitry to be greater. Because the enclosure 12 is environmentally-sealed, heat generated by the backlights 22, the electronic circuitry, and external sources needs to be dissipated outside of the enclosure 12 in order for the LCD module 26 to operate at a lower temperature. For example, some LCD modules 12 may need to be kept at temperatures at or lower than 70 degrees Celsius to operate properly. One solution is to reduce the power to the backlights 22 that in turn lowers the heat generated by the backlights 22, but this also reduces the brightness of the LCD display 10.

The present invention may be used to avoid having to reduce the brightness of the backlights 22. Heat generated by the LCD display 10 may be convectively dissipated in two manners. The LCD display 10 dissipates heat inside the enclosure 12 using one or more heat sinks 24 attached to the rear portion 16 of the enclosure 12. The heat sink 24 may contain one or more fins 25 to create greater surface area on the heat sink 24 for dissipation of heat. This heat sink 24 ensures that the internal surface temperature of the enclosure 12 is kept as close to the atmospheric temperature as possible to ensure that the heated air inside the enclosure 12 is absorbed by the enclosure 12. FIG. 1 illustrates the heat dissipated by the heat sink 24 to the atmosphere using arrows pointing upward on the outside of the rear portion 16 of the enclosure 12.

Heat generated by the backlights 22 is dissipated through the heat sink 24. The backlight assembly 20 is located against the surface of the rear portion 16 of the enclosure 12. In one embodiment, the center of the backlights is approximately 3.25 millimeters from the rear portion 16 of the enclosure 12. In this manner, heat generated by the backlights 22 is convectively transferred to the atmosphere, using natural convection. The heat generated by the backlights 22 is transferred to the rear portion 16 of the enclosure 12 and to the heat sink 24. The closer the heat sink 24 is to the backlights 22, the faster heat generated by the backlights 22 can be transferred outside of the enclosure 12 thereby reducing the chance of such heat to increase the ambient air inside the enclosure 12.

Heat generated by the backlights 22 that is not immediately dissipated through the rear portion 16 of the enclosure 12 and the heat sink 24 causes the ambient air temperature inside the enclosure 12 to rise. Heat generated by electronic circuitry inside the enclosure 12 and any external heat on the enclosure 12, such as sunlight, also causes the ambient air temperature inside the enclosure 12 to rise. To dissipate the heat in the ambient air, thereby cooling the LCD module 26, an airflow path 30 is created around the LCD module 26 by placement of the LCD module 26 between the lens 18 and the backlight assembly 20. In one embodiment of the present invention, the back of the LCD module 26 is placed approximately 12.9 millimeters from the backlights 22 to properly diffuse and evenly backlight the LCD module 26. The front of the LCD module 26 is placed approximately 9.4 millimeters from the lens 18 so that any protrusion on the lens 18 does not damage the LCD module 26. Spacing between the lens 18 and the LCD module 26 also allows air to be routed across the LCD module 26 for thermal management, as discussed below. The LCD module 26 is also placed between the top and bottom of the enclosure 12 in the vertical plane so that air gaps 28A and 28B are formed on the top and bottom of the LCD module 26. In this manner, air is free to flow around the LCD module 26 in a circular fashion, as illustrated by the counter-clockwise airflow arrows moving around the LCD module 26 in FIG. 1.

In order to dissipate heat in the ambient air in the enclosure 12, a fan 32 is placed in the airflow path 30. The fan 32 provides forced convection of the ambient air inside the enclosure 12 to the rear portion 16 of the enclosure 12 for dissipation. In one embodiment, the fan 32 is placed at the top of the enclosure 12 above the LCD module 26. During operation, that fan 32 rotates counter-clockwise to create the counter-clockwise circular airflow path 30. The ambient air is routed to the rear of the LCD module 26 and to the rear portion 16 of the enclosure 12 for dissipation through the enclosure 12 to the heat sink 24 and to the atmosphere.

The fan 32 may be any type of air movement device that can create the airflow path 30; however, one embodiment of present invention employs a laminar flow fan 32 manufactured by Delta Corporation. An example of such a laminar flow fan 32 is disclosed in U.S. Pat. No. 5,961,289 entitled "Cooling axial flow fan with reduced noise levels caused by swept laminar and/or asymmetrically staggered blades," incorporated herein by reference in its entirety. A laminar flow fan 32 creates a sheet of air, rather than turbulent air, across the LCD module 26. The laminar airflow is more efficient than turbulent airflow for moving air and transferring heat from the front of the LCD module 26 to the rear portion 16 of the enclosure 12. A more efficient fan 32 allows selection of a fan 32 that is smaller in size since it may require less rotations of the fan 32 to move an amount of air desired and/or move the same amount of air in a smaller airflow path 30. Each of these factors contributes to a smaller fan 32 size that in turn contributes to a thinner depth enclosure 12. In one embodiment, the fan 32 operates at approximately 3400 revolutions per minutes (RPM). However, the present invention may use any type of fan 32, including those that generate turbulent air. The fan 32 speed may also be adjusted to move air in the desired manner and efficiency.

Figure 2:
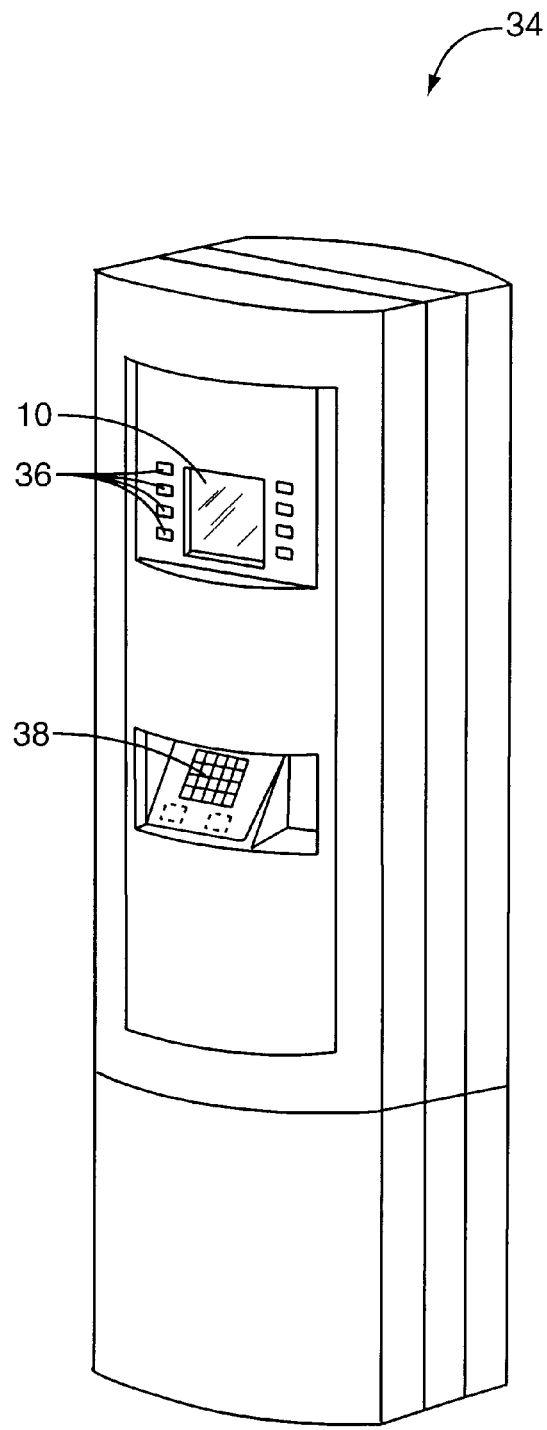
FIG. 2 is a schematic diagram of a kiosk having a LCD display according to the present invention.

FIG. 2 illustrates one embodiment of a device that incorporates the LCD display 10 known as a "kiosk" 34. A kiosk 34 is any type of interactive electronic device that provides an input device, an output device, or both. Kiosks 34 are typically used in retail environments to sell products and/or services to customers. Some common types of kiosk 34 include vending machines, fuel dispensers, automatic teller machines (ATM), and the like. FIG. 2 illustrates one example of a kiosk 34 that includes the LCD display 10 illustrated in FIG. 1 as an output device for displaying information. Soft keys 36 are located on each side of the LCD display 10 as an input device for customer selections; however, an input device may also take others forms, such as a keypad 38, touch screen keys on the LCD display 10 (not shown), card entry device, magnetic or optically encoded cards for example, voice recognition, etc. The LCD display 10 of the present invention is particularly suited for kiosks 34 that are located in outdoor environments where the enclosure 12 of the LCD display 10 is environmentally-sealed. However, the LCD display 10 may be placed in any type of kiosk 34 regardless of whether the kiosk 34 is placed in an outdoor environment.

Figure 3:
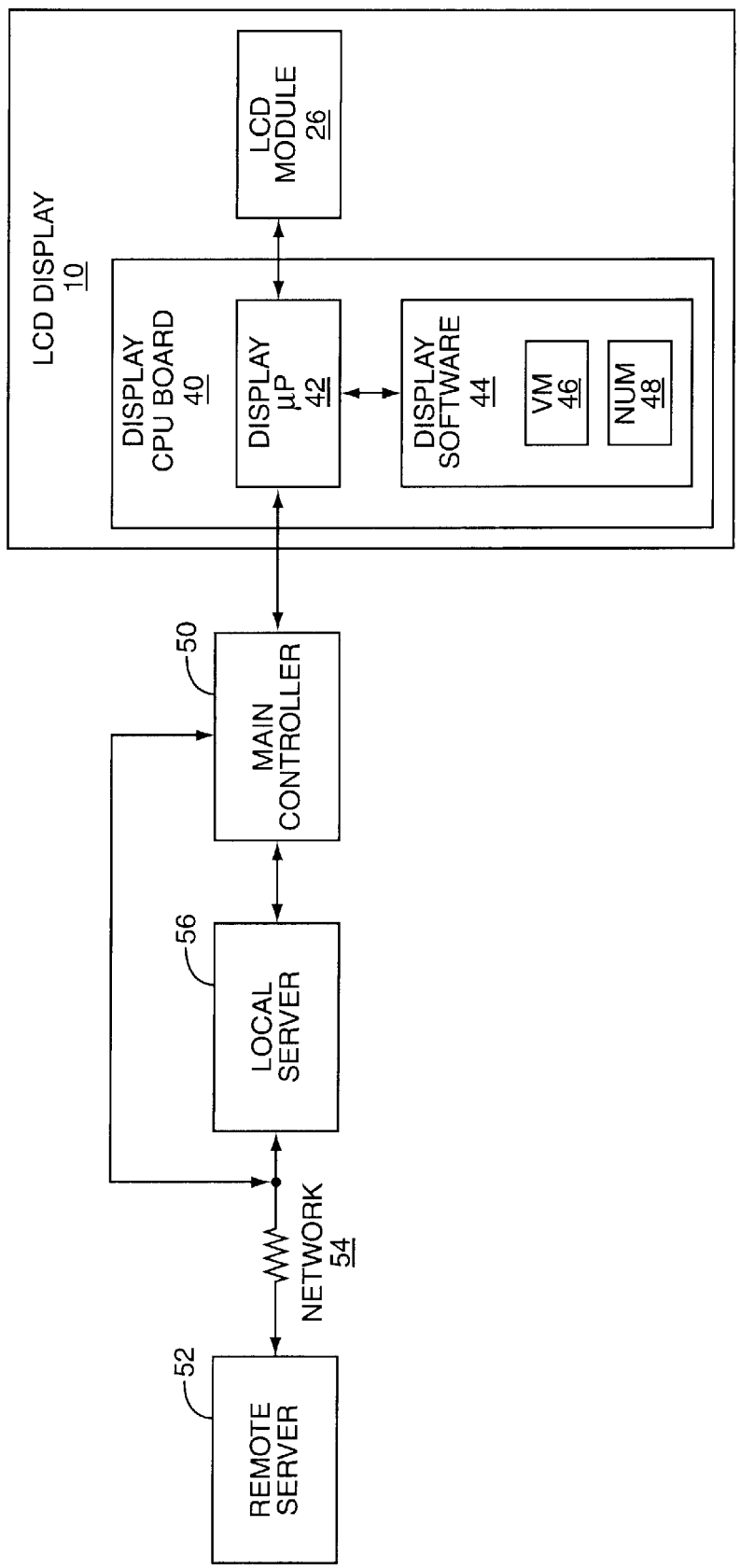
FIG. 3 is a schematic diagram of one embodiment of the LCD display electronics architecture.

FIG. 3 illustrates one embodiment of a communication architecture used for the LCD display 10. The LCD display 10 comprises a display CPU board 40 that contains electronics and software. In this particular embodiment, the display CPU board 40 contains a single display microprocessor 42 and display software 44. The display software 44 contains both volatile memory 46, such as RAM and/or flash memory, and non-volatile memory 48, such as EPROM and/or EEPROM. The display software 44 contains program instructions for the display microprocessor 42 and may also contain information to be displayed on the LCD module 26. The display microprocessor 42 may also manages information received from external sources and controls the operation of the LCD module 26.

In this embodiment, information is communicated from one or more external devices to the display microprocessor 42 to then be displayed on the LCD module 26. A main controller 50 is provided as the interface to the display microprocessor 42. The main controller 50 may be any type of control system, including a point-of-sale system for example. The main controller 50 may be coupled to more than one display microprocessor 42 for managing multiple LCD modules 26. The main controller 50 may also be connected to a local server 56, located in close proximity to the LCD display 10, that sends information to be displayed on the LCD module 26. A remote server 52, located remotely from the LCD display 10, may also be provided to send information to the LCD module 26. The remote server 52 may send information over a network 54 directly to the display microprocessor 42, through the main controller 50, and/or through the local server 56 to be eventually displayed on the LCD module 26. The remote server 52, the local server 56, the main controller 50, and the display microprocessor 42 may be coupled each other through either a wired or wireless connection or network 54 using any type of communication technology, including but not limited to the Internet, serial or parallel bus communication, radio-frequency communication, optical communication, etc.

Examples of Internet information management that may be used with the present invention to send information to a LCD display 10 and/or communicate information entered into a LCD display 10 having a touch screen or other electronic device incorporating an LCD display 10 are disclosed in U.S. Pat. Nos. 6,052,629 and 6,176,421 entitled "Internet capable browser dispenser architecture" and "Fuel dispenser architecture having server" respectively, both of which are incorporated herein by reference in their entirety.

Figure 4:
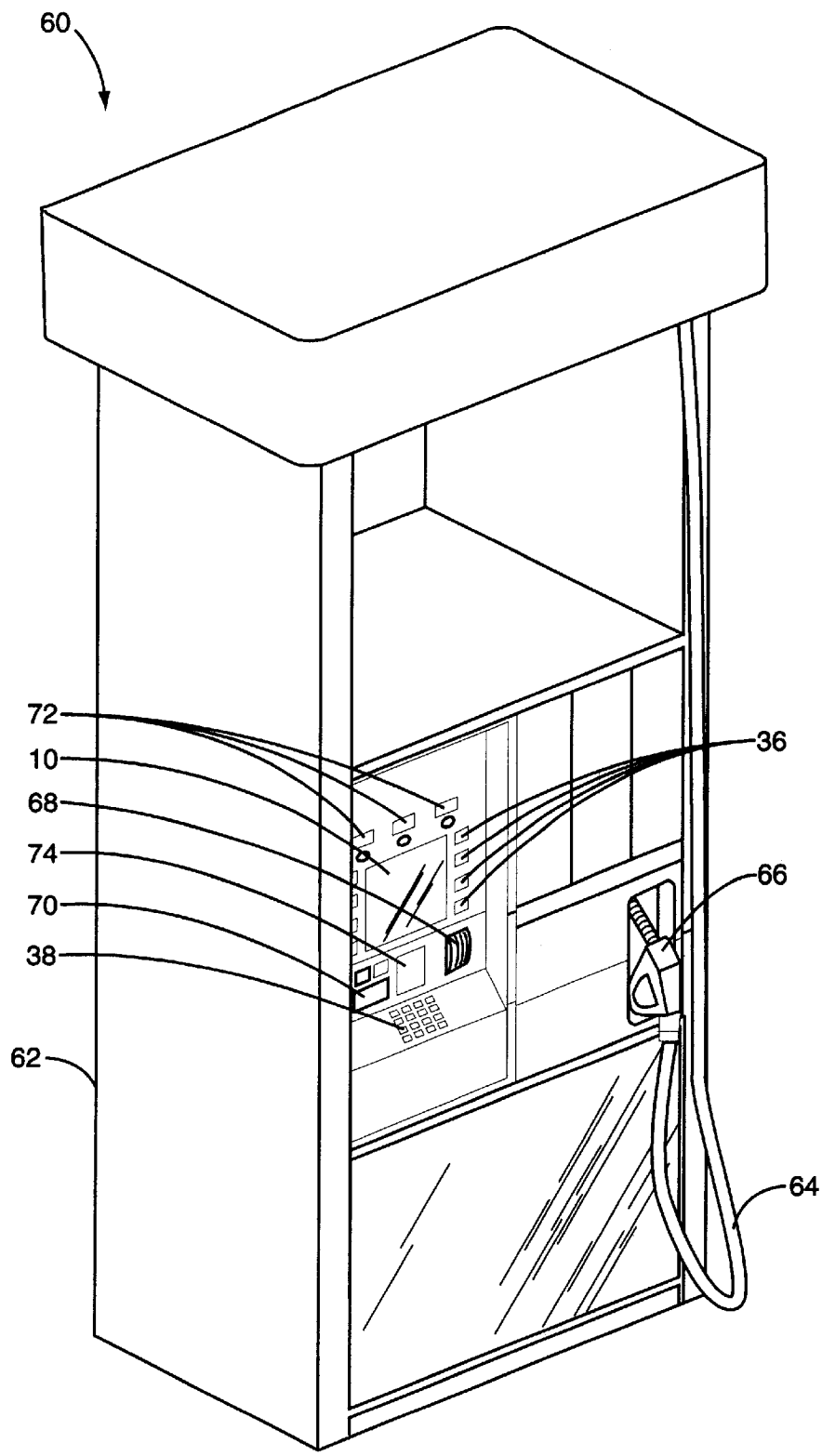
FIG. 4 is a schematic diagram of a fuel dispenser having a LCD display according to the present invention.

FIG. 4 illustrates another exemplary outdoor device that may incorporate the LCD display 10 of the present invention known as a "fuel dispenser" 60. A fuel dispenser 60 may also be considered a type of kiosk 34 depending on its configuration and features. The illustrated fuel dispenser 60 contains a LCD display 10 for providing instructions and/or information to a customer at the fuel dispenser 60. The fuel dispenser 60 is comprised of a housing 62 and at least one energy-dispensing outlet, such as a hose 64 and nozzle 66 combination, to deliver fuel to a vehicle (not shown). As illustrated in FIG. 2, the fuel dispenser 60 may have other input and/or output devices for interaction with a customer, such as price-per-unit of fuel displays 72, soft-keys 36, a receipt printer 68, a radio-frequency identification (RFID) antenna 74, and a cash acceptor 70.

Also note that the LCD display 10 may also be placed external to the fuel dispenser 60 and attached to the fuel dispenser 60 as disclosed in co-pending patent application entitled "Multiple browser interface," filed on Apr. 23, 2001.

Certain modifications and improvements will occur to those skilled in the art upon a reading of the foregoing description. It should be understood that the present invention is not limited to any particular type of component in the LCD display 10 including, but not limited to the enclosure 12, the lens 18, the backlight 22 and backlight assembly 20, the heat sink 24, the LCD module 26, and the fan 32. Additionally, the LCD display 10 may be used in any type of device having or using a display, including but not limited to a personal computer, a kiosk 34, an elevator, an ATM, and a fuel dispenser 60. Also for the purposes of this application, couple, coupled, or coupling is defined as either a direct connection or a reactive coupling. Reactive coupling is defined as either capacitive or inductive coupling.

One of ordinary skill in the art will recognize that there are different manners in which these elements can accomplish the present invention. The present invention is intended to cover what is claimed and any equivalents. The specific embodiments used herein are to aid in the understanding of the present invention and should not be used to limit the scope of the invention in a manner narrower than the claims and their equivalents.

What is claimed is:

1. A LCD display, comprising:

an environmentally-sealed enclosure having a front portion and a rear portion;

a lens placed on said front portion for viewing of the LCD display;

a backlight assembly attached to said rear portion and having at least one backlight;

a heat sink connected to the outside of said rear portion to convectively transfer heat through said enclosure to the atmosphere;

a LCD module located in between said lens and said backlight assembly and in between the top and bottom of said enclosure to form air gaps at the top and bottom of the inside of said enclosure to form a circular airflow path for the ambient air inside said enclosure; and a fan placed in said airflow path to circulate the ambient air inside said enclosure to said rear portion to transfer heat in the ambient air through said enclosure to said heat sink and to the atmosphere using forced convection.

2. The LCD display of claim 1, wherein said heat sink transfers heat generated by said at least one backlight through said enclosure to said heat sink and to the atmosphere using natural convection.

3. The LCD display of claim 1, wherein said fan is an axial fan.

4. The LCD display of claim 1, wherein said fan produces a laminar airflow across said LCD module.

5. The LCD display of claim 1, wherein said fan rotates at a speed of around about 3400 rpm.

6. The LCD display of claim 1, wherein said fan is placed in said airflow path at an end of said enclosure.

7. The LCD display of claim 1, wherein said fan is placed in said airflow path in between the ends of said enclosure.

8. The LCD display of claim 1, wherein said enclosure is less than or equal to a depth of around about 40 millimeters.

9. The LCD display of claim 1, wherein said LCD module is spaced at a distance of around about 9.4 millimeters from said lens.

10. The LCD display of claim 1, wherein said enclosure is constructed out of materials comprised from the group consisting of sheet metal, aluminum, and copper.

11. The LCD display of claim 1, wherein said backlight assembly is physically connected to said rear portion of said enclosure.

12. The LCD display of claim 1, wherein said backlight assembly comprises a backlight reflector that is attached to said rear portion to place said at least one backlight bulb in close proximity to said rear portion.

13. The LCD display of claim 1, further comprising a control system that controls information displayed on said LCD module.

14. The LCD display of claim 13, wherein said control system is comprised of electronics having a microprocessor and software.

15. The LCD display of claim 1, wherein said LCD module is adapted to display an Internet browser.

16. The LCD display of claim 1, wherein said enclosure is less than or equal to a depth of around about 40 millimeters.

17. An energy dispenser that dispenses energy into a customer's vehicle, comprising:

a housing;

an energy-dispensing outlet;

a control system in said housing that controls the dispensing of the energy through said energy dispensing outlet; and a LCD display under control of said control system that displays information to the customer, said LCD display comprising:

an environmentally-sealed enclosure having a front portion and a rear portion;

a lens placed on said front portion for external viewing of the LCD display;

a backlight assembly attached to said rear portion and having at least one backlight;

a heat sink connected to the outside of said rear portion to convectively transfer heat through said enclosure to the atmosphere;

a LCD module located in between said lens and said backlight assembly and in between the top and bottom of said enclosure to form air gaps at the top and bottom of the inside of said enclosure to form a circular airflow path for the ambient air inside said enclosure; and a fan placed in said airflow path to circulate the ambient air inside said enclosure to said rear portion to transfer heat in the ambient air through said enclosure to said heat sink and to the atmosphere using forced convection.

18. The energy dispenser of claim 1, wherein said heat sink transfers heat generated by said at least one backlight through said enclosure to said heat sink and to the atmosphere using natural convection.

19. The energy dispenser of claim 17, wherein said information is comprised from the group consisting of text and graphical information.

20. The energy dispenser of claim 17, wherein said information is comprised from the group consisting of weather, stock quotes, discounts, advertising, coupons, purchasing information, and special purchases.

21. The LCD display of claim 17, wherein said fan is an axial fan.

22. The LCD display of claim 17, wherein said fan produces a laminar airflow across said LCD module.

23. The LCD display of claim 17, wherein said fan rotates at a speed of around about 3400 rpm.

24. The LCD display of claim 17, wherein said fan is placed in said airflow path at an end of said enclosure.

25. The LCD display of claim 17, wherein said fan is placed in said airflow path in between the ends of said enclosure.

26. The LCD display of claim 17, wherein said enclosure is less than or equal to a depth of around about 40 millimeters.

27. The LCD display of claim 17, wherein said LCD module is spaced at a distance of around about 9.4 millimeters from said lens.

28. The LCD display of claim 17, wherein said enclosure is constructed out of materials comprised from the group consisting of sheet metal, aluminum, and copper.

29. The LCD display of claim 17, wherein said backlight assembly is physically connected to said rear portion of said enclosure.

30. The LCD display of claim 17, wherein said backlight assembly comprises a backlight reflector that is attached to said rear portion to place said at least one backlight bulb in close proximity to said rear portion.

31. The LCD display of claim 17, further comprising a control system that controls information displayed on said LCD module.

32. The LCD display of claim 31, wherein said control system is comprised of electronics having a microprocessor and software.

33. The LCD display of claim 17, wherein said LCD module is adapted to display an Internet browser.

34. The LCD display of claim 17, wherein said energy dispenser is a fuel dispenser.

35. A method of manufacturing a cooled LCD display in an environmentally-sealed disclosure, comprising the steps of:

placing a lens on a front portion of the enclosure;

attaching a backlight assembly to a rear portion of the enclosure;

placing at least one backlight in said backlight assembly;

attaching a heat sink to the outside of said rear portion to convectively transfer heat through said enclosure to the atmosphere;

placing a LCD module in the enclosure in between said lens and said backlight assembly and leaving gaps at the top and bottom of the inside of the enclosure to form a circular air flow path around said LCD module; and placing a fan in said airflow path to circulate the ambient air inside said enclosure to said rear portion to transfer heat in the ambient air through said enclosure to said heat sink and to the atmosphere using forced convection.

36. The method of claim 35, further comprising transferring heat generated by said at least one backlight through said enclosure to said heat sink and to the atmosphere using natural convection.

37. The method of claim 35, further comprising mounting said enclosure in an energy dispenser.

38. The method of claim 37, further comprising attaching a control system to said LCD module for controlling information displayed on said LCD module.

39. Further comprising transferring heat generated by at least one backlight to the enclosure through said heat sink and to the atmosphere using natural convection; and a method of lowering the temperature of ambient air inside an environmentally-sealed enclosure for a LCD display, comprising the steps of:

heating the ambient air inside the enclosure by operation of the LCD display;

moving the ambient air inside in the enclosure to a rear portion of the enclosure; and convectively transferring the heat in the ambient air to the atmosphere by transferring the heat through a heat sink attached to said rear portion of the enclosure using forced convection.

\* \* \* \* \*